United States Patent [19]

Schiele et al.

[11] 4,445,494
[45] May 1, 1984

[54] APPARATUS FOR SUPPORTING CRYSTALLINE WAFERS

[75] Inventors: Bernd Schiele, Burghausen; Johann Niedermeier, Burgkirchen, both of Fed. Rep. of Germany

[73] Assignee: Wacker-Chemitronic Gesellschaft fur Elektronik-Grundstoffe mbH, Burghausen, Fed. Rep. of Germany

[21] Appl. No.: 304,941

[22] Filed: Sep. 23, 1981

[30] Foreign Application Priority Data

Sep. 30, 1980 [DE] Fed. Rep. of Germany ....... 3036829

[51] Int. Cl.³ .............................................. B28D 7/04
[52] U.S. Cl. ................................. 125/35; 51/216 R; 83/98; 125/13 R; 269/20
[58] Field of Search ................ 269/20; 51/73, 216 R; 125/13 R, 35; 83/98; 239/459

[56] References Cited

U.S. PATENT DOCUMENTS

| | | | |
|---|---|---|---|
| 2,064,794 | 12/1936 | Klauminzer | 239/459 |
| 3,039,235 | 6/1962 | Heinrich | 51/73 |
| 3,040,486 | 6/1962 | Balsiger | 51/236 |
| 3,132,454 | 5/1964 | Balsiger | 51/236 |
| 3,189,340 | 6/1965 | Desel | 269/20 |
| 3,449,835 | 6/1969 | Liner | 51/236 |
| 3,488,674 | 1/1970 | Simjian | 269/20 |
| 3,577,861 | 5/1971 | Bender | 51/73 R |
| 4,084,354 | 4/1978 | Grandia | 51/73 R |
| 4,227,348 | 10/1980 | Demers | 125/13 R |

*Primary Examiner*—Harold D. Whitehead
*Attorney, Agent, or Firm*—Burgess, Ryan & Wayne

[57] ABSTRACT

A process and apparatus for supporting crystalline wafers utilizing the suction effect of flowing gas on the crystalline wafers. An almost point-like support of the crystalline wafer is achieved. Furthermore, the invention relates to a holding tool for carrying out the process, which tool has at the center of the holding face, a point-like projection.

8 Claims, 3 Drawing Figures

APPARATUS FOR SUPPORTING CRYSTALLINE WAFERS

The invention relates to an apparatus for supporting crystalline wafers produced by a separation operation, which process utilizes the suction effect of gas flowing past the wafer.

BACKGROUND OF THE INVENTION

Crystalline wafers are usually produced by sawing crystalline rods into slices. A problem arises near the end of the separation operation when there is only a thin, increasingly mechanically fragile residual connection between the wafer and rod. The forces which are produced on the wafer during the separation operation finally twist or break off the residual connection, leaving a stump on the surface of the wafer, which has to be removed in a further working step. Additionally, breaks often occur in the surface of the wafer, which render the wafer of no further use.

In order to avoid the problems which occur near the end of the separation operation, the wafer should be supported as securely as possible. Experience has shown that the wafer cannot be satisfactorily supported by means of grippers or the like, since scratches on the wafer, or even breaks in its edges, occur at the points of contact with the gripping devices. Furthermore, the crystalline wafers, which are usually very thin, bend when gripped too securely, with the result that a wafer having parallel faces can no longer be produced.

A holding tool, which works on aerodynamic principles, has been developed. It has a circular holding face, in the center of which is a counter-sunk nozzle from which gas flows at an acute angle to the holding face. At a certain spacing of the holding face from the wafer, the wafer is forced toward the holding face by a reduction in pressure between the wafer and the holding face caused by the gas flowing between the wafer and the holding face according to the Bernoulli principle. In order to prevent the wafer from sliding or wobbling, the holding tool has a raised stop extending around two thirds of the holding face. The gas flow causes the wafer to contact the stop and scratches or breaks can be produced on the wafer. Such damage can occur as the wafer is released, if it slips sideways or slides against the stop.

A holding tool which supports a wafer without touching it has also been proposed in DE-OS 26 09 754. The device works on the aerodynamic principle outlined above. The wafer is suspended on a gas cushion formed by gas flowing between the wafer and a holding plate and at the same time is held securely by the pressure effect of the gas moving preferably, in laminar flow, past the edge of the wafer. Damage caused to the wafer by the holding tool is naturally prevented.

The present invention is an apparatus that combines support of the wafer with only minor contact with the ability to securely hold the wafer on the holding tool.

BRIEF DESCRIPTION OF THE INVENTION

Unexpectedly, it has been discovered that only a point-like contact is necessary to provide support and to hold the wafer securely on the holding tool. In the present invention, the wafer is held in contact with an almost pointlike support by the pressure effect of a gas moving between the wafer and the holding tool according to the above-described aerodynamic principle.

The invention is a process and apparatus for supporting crystalline wafers wherein the disc is supported at the center by an almost point-like support.

A centrally attached projection on the holding face of the holding tool provides the support. This projection can be provided with a curved surface facing the wafer such that only point-like contact is produced. The projection can be shaped like a rounded cap, a needle, a pin or a ball, and preferably a ball. The diameter of the ball is preferably from 0.5 to 3% of the diameter of the holding face. The support projection preferably has a polished surface and is manufactured from a material that has a higher hardness than that of the wafer to be supported.

DETAILED DESCRIPTION OF THE INVENTION

Figure 1:
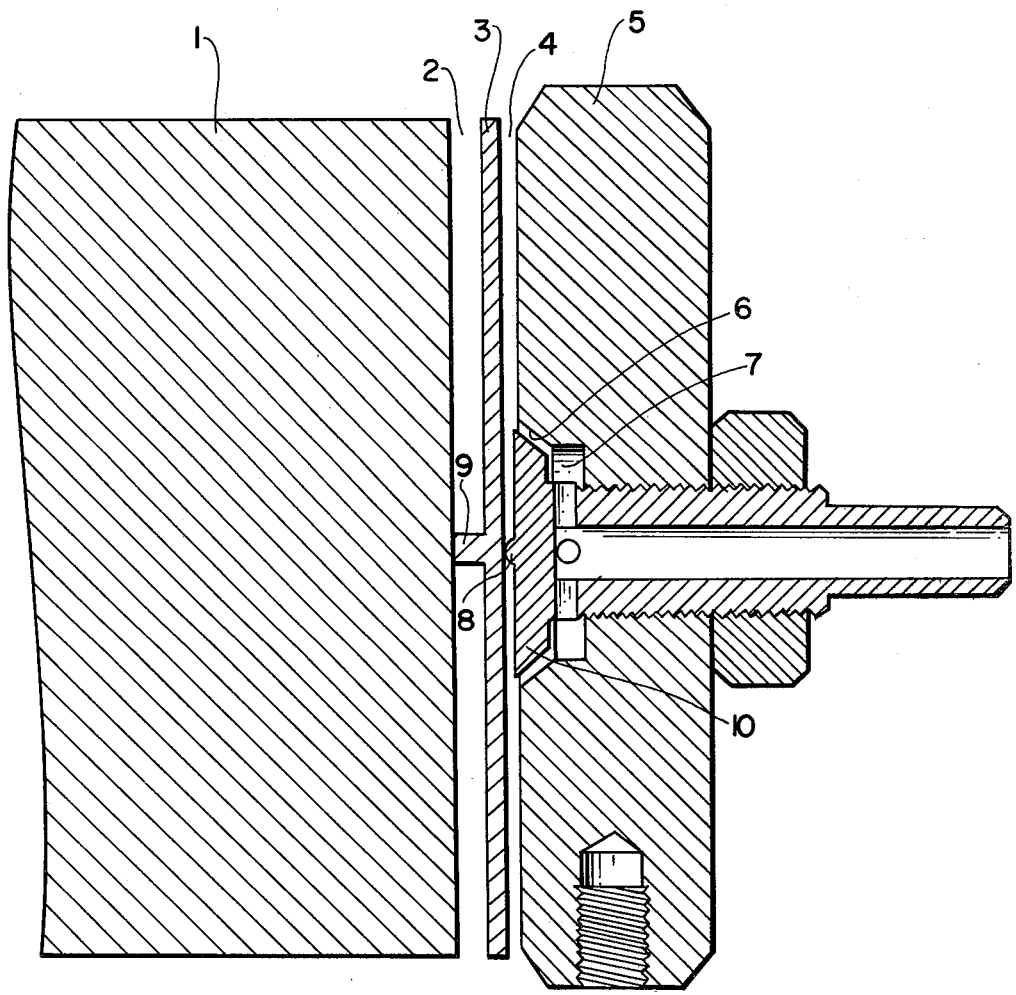
FIG. 1 is a view in section of a wafer supported by the apparatus of the present invention near the end of the separation.

The process is carried out in the following manner: a holding tool, having a holding face arranged parallel to the wafer, is brought sufficiently close to the wafer being separated, during the separation operation, or at least in the final phase thereof, and is adjusted so that the support formed by the projection on the holding face touches the center of the wafer. A gas flow emerging from the holding face and striking the wafer at an acute angle washes around the wafer. The gas flow produces, in a manner known per se, a pressure effect that presses the center of the wafer onto the support while the wafer is suspended over its remaining area on the gas cushion produced by the gas flow, and is thus stabilized in its position. The pressure force acting on the wafer is regulated primarily by varying the volume of gas flowing and by the clear width of the gas nozzle. The nozzle is usually constructed in the holding tool in the form of an annular slot. Preferably, the gas flow within the nozzle is laminar since turbulence results in relatively high energy losses.

After the wafer has been separated from the rod, the holding tool carrying the wafer is swung away and the wafer is transferred to a collecting device.

The process can generally be used in those separation processes wherein crystalline wafers are produced individually. The process and apparatus according to the invention are used when separation is carried out using a rotating crystalline rod which is pressed against the saw blade and preferably using a circular saw having an internal cutting edge. When a circular saw blade having an internal cutting edge is used, the saw blade is clamped at its periphery, the circumference of the concentric hole which is the actual cutting edge is, in most cases, set with diamonds. The crystalline rod to be cut into wafers is passed, preferably while being rotated about its longitudinal axis, into the central hole of the saw blade, to a length corresponding to the desired thickness of the wafer and is moved outwards against the sawing edge.

In principle, the process can be carried out with both horizontal and vertical arrangements.

The process is particularly useful when cutting hard materials. Examples of such materials are, inter alia, elemental silicon, gallium arsenide, sapphire, gadolinium gallium garnet, lithium niobate, and the like.

A further object of the invention is a holding tool for carrying out the process, which is characterized in that the holding face of the tool has, at its center, a point-like projection.

The holding tool comprises a removal plate which is usually attached to a swivelling device for transporting the discs after separation. The removal plate is provided at its center with a conical bore that expands in the direction toward the wafer. A cone is fitted into the conical bore to provide a passage for the gas between the cone and the bore. The passage between the cone and the conical bore, on the side remote from the wafer, communicates with a source of gas at a controlled pressure.

The removal plate is preferably circular, but can have any other geometrical shape. The characteristic diameter of the holding face to which the following data relates is, in each case, that of the diameter of the largest circle that can be inscribed thereon.

Around the circumference of an imaginary concentric circle in the holding face, the diameter of which circle corresponds to from 0.1 to 0.6 of the diameter of the plate, openings for the outlet of the gas in the direction towards the wafer are arranged equidistant from one another. The spacing between the openings, measured around the circumference of the circle varies from about $\frac{2}{3}\pi r$ to 0, the clear width being about 0.02 to 2% of the diameter of the plate. The openings are disposed along the generated surface of a cone of which the area of the base corresponds to that of the imaginary circle and of which the apex angle is from approximately 20° to 150°. Inside the removal device, the openings communicate with a source of gas.

The spacing between the openings is preferably zero, thus providing a continuous annular nozzle.

This embodiment can be manufactured easily by boring the basic element in the shape of a cone, starting from the surface, the apex angle of the cone being approximately from about 20° to 150°, preferably from about 50° to 110°. The bored cone base is larger, by from about 0.02 to 1%, preferably by from about 0.02 to 0.4%, of the diameter of the plate, than a core in the shape of a cone fitted into the bored conical opening.

The diameter of the base of the core varies from about 0.1 to 0.6 of the diameter of the plate and the apex angle by from about 0° to 50°, preferably from about 10° to 30°, greater than that of the funnel opening.

The truncated cone is preferably mounted in the funnel opening such that it can be moved along its longitudinal axis in order to vary the width of the slot formed between the bored cone and the conical core (clear width of the opening). This can be achieved very easily by providing the cylindrical portion that axially adjoins the truncated core with a male thread. Fixing is preferably effected by means of a lock-nut on this thread.

At the center of the basal face of the truncated cone there is provided a localized projection for supporting the wafer. This projection is preferably formed as a ball the diameter of which is from about 0.5 to 3% of the diameter of the plate.

Essentially, any machinable material, especially metals, can be used for the manufacture of the holding tool. The localized projection serving as support for the wafer preferably is made from a material with a hardness that is greater than that of the wafer to be produced.

The gas flow is preferably regulated in such a manner that, in the region of the outlet of the gas from the holding tool, the flow of gas is laminar, even though turbulent flow does not, in principle, prevent operation of the tool. The gas flowing out radially meets the wafer to be cut at an acute angle and produces, in a manner known per se, a dynamically balanced field of pressure between the holding tool and the wafer.

Figure 2:
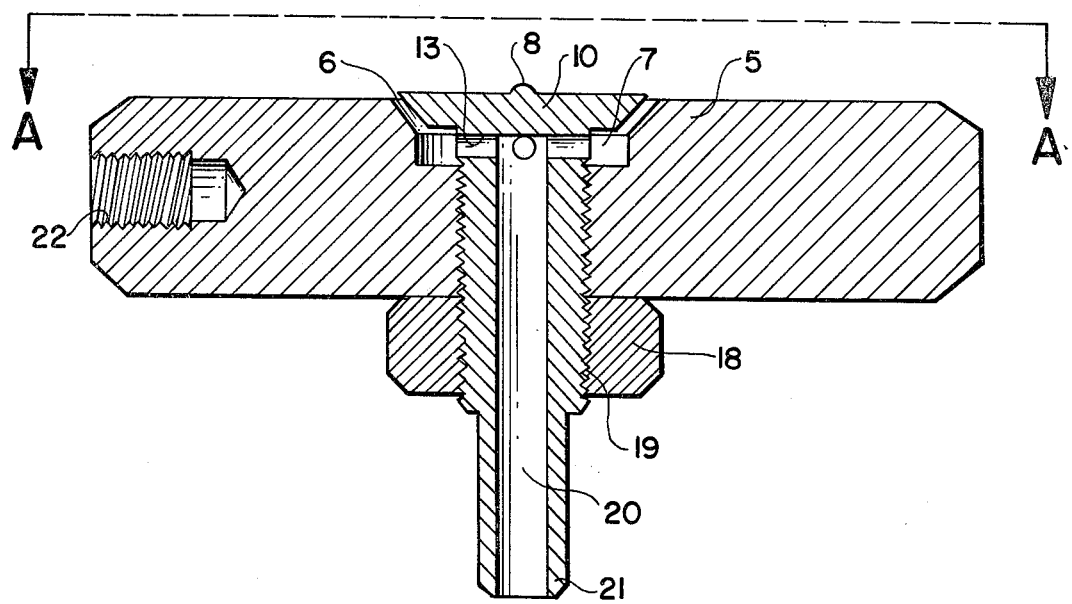
FIG. 2 is a view in section of a preferred embodiment of the apparatus of the present invention.
Figure 3:
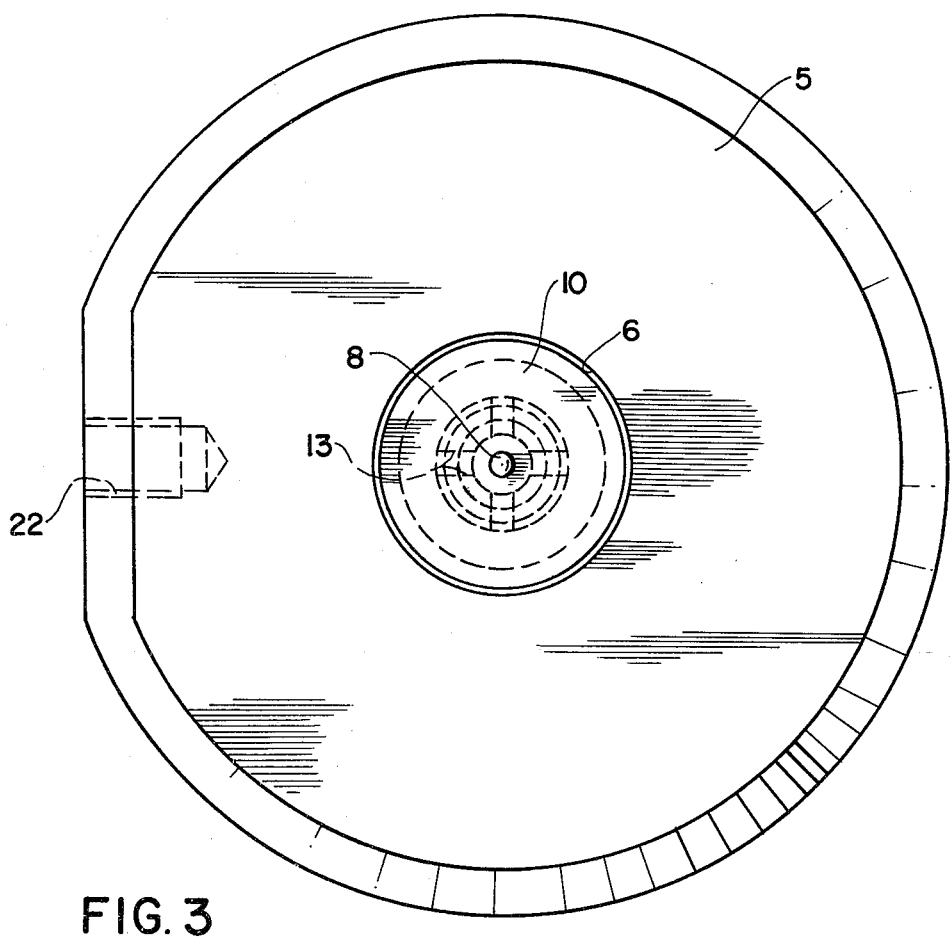
FIG. 3 is a view in the direction A—A of the apparatus of FIG. 2.

FIGS. 1, 2 and 3 illustrate preferred embodiments of the holding tool according to the invention. The same numbers will be used to denote the same elements in the figures. FIG. 1 shows in section the apparatus of the present invention during production of a wafer. The holding tool is adjusted relative to the crystalline rod 1 in such a manner that the supporting ball 8 touches the center of the wafer 3 to be separated. In the critical phase of the separation operation, the disc is still connected to the crystalline rod by means of a stump 9, whereas over the major proportion of the face, the sawing slot 2 between the wafer and the rod has already been formed.

The holding tool comprises the holding plate 5, which has a conical bore directed towards the disc to be separated, which bore forms, with the guide cone 10, an annular nozzle 6. The gas flows through the annular channel 7, travels in laminar flow through the annular nozzle 6 and finally flows over the wafer in a dynamically balanced manner. In the region between the holding plate and the wafer, a region of reduced pressure 4, caused by the flow of gas, is formed.

FIG. 2 shows a cross-section through the holding tool, and FIG. 3 shows a plan view of a holding tool according to the invention.

At its upper end, the holding plate 5 has a conical bore which, with the guide cone 10, forms the annular nozzle 6. The connection between the holding plate and the guide cone is provided in the lower portion by the screw-thread 19. This connection can be displaced vertically and determines the width of the annular slot 6. The desired position can be fixed by the lock-nut 18. Gas is supplied by means of the feed-pipe 21 and central bore 20 of the guide cone and enters the annular chamber 7 through bores 13 and finally emerges through the annular slot 6. The ball 8, serving as a support for the wafer to be separated (not shown), is attached at the center of the holding plate which, at the same time, forms the center of the guide cone.

As can be seen from FIG. 3, the holding plate has a lateral flattened portion having a bore 22 that serves to mount the holding plate on a swivelling device.

According to the process of the invention or with the aid of the holding tool according to the invention, it is possible to reduce the torsional moment, occurring during the end phase of the separation operation, on the residual connection of the wafer to be obtained and the crystalline rod to such an extent that the stump can be sawed across without leaving any residual material. In this operation, the wafer is fixed almost without tensile or bending stress so that a cut having parallel faces is insured.

We claim:

1. A holding tool which comprises a holding plate having a surface which faces an article being held, an annular nozzle, in the holding plate, formed by a conical hole and a conical guide cone, having a base, mounted in the conical hole with the base of the conical guide cone facing the article being held, a point-like projection, protroding from the center of the base of the conical guide cone, for contacting the article being held and means for providing a controlled flow of gas from the annular nozzle.

2. The holding tool of claim 1 wherein the annular nozzle is formed from spaced segments which spacing varies from about $\frac{2}{3}\pi r$ to 0.

3. The holding tool of claim 2 wherein the spacing is zero whereby a continuous annular nozzle is formed.

4. The holding tool of claim 1 wherein the point-like projection has a spherical surface.

5. The holding tool of claim 1, 2 or 3 wherein the annular nozzle has a clear width of about 0.02 to 2% of the diameter of the holding plate.

6. The holding tool of claim 5 wherein the guide cone has an apex angle of from about 20° to 150°.

7. The holding tool of claim 6 wherein the apex angle of the guide cone is between about 50° and 110°.

8. The holding tool of claim 5 wherein the diameter of the conical hole is from about 0.02 to 1% of the diameter of the plate, longer than the diameter of the base of the conical guide cone.

* * * * *